(12) United States Patent
Gojny et al.

(10) Patent No.: US 9,535,419 B2
(45) Date of Patent: Jan. 3, 2017

(54) DEVICE AND METHOD FOR THE RESIDUAL ANALYSIS OF A RESIDUUM TO DETECT SYSTEM ERRORS IN THE SYSTEM BEHAVIOUR OF A SYSTEM OF AN AIRCRAFT

(75) Inventors: Marcus Gojny, Beauzelle (FR); Udo B. Carl, Hamburg (DE); Helge Sachs, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 1406 days.

(21) Appl. No.: 13/283,164

(22) Filed: Oct. 27, 2011

(65) Prior Publication Data
US 2012/0101794 A1     Apr. 26, 2012

Related U.S. Application Data

(63) Continuation of application No. PCT/EP2010/055664, filed on Apr. 28, 2010.
(Continued)

(30) Foreign Application Priority Data

Apr. 28, 2009    (DE) ........................ 10 2009 002 682

(51) Int. Cl.
    *G05B 23/02*        (2006.01)
    *G06F 17/50*        (2006.01)
    (Continued)

(52) U.S. Cl.
    CPC ........... *G05B 23/0254* (2013.01); *G05B 17/00* (2013.01); *G05B 23/0202* (2013.01);
(Continued)

(58) Field of Classification Search
    CPC .. G06F 17/5009; G06F 17/10; G06F 17/5095; G06F 17/11; G06F 17/13; G06F 17/5086; G06F 11/13; G05B 23/0254; G05B 23/0202; G05B 23/0235; G05B 17/00
(Continued)

(56) References Cited

U.S. PATENT DOCUMENTS 5,319,296 A     6/1994   Patel
5,847,952 A *    12/1998   Samad ................. G05B 13/027
                                                 700/37
(Continued)

FOREIGN PATENT DOCUMENTS

CN            1932469        3/2007
DE      102005018980 B4    12/2011
(Continued)

OTHER PUBLICATIONS

M. Curvo, NPL, "Estimation of Aircraft Aerodynamic Derivatives Using Extended Kalman Filter", 2000.*
(Continued)

*Primary Examiner* — Akash Saxena
(74) *Attorney, Agent, or Firm* — Jenkins, Wilson, Taylor & Hunt, P.A.

(57) ABSTRACT

The present invention provides a device and a method for the residual analysis of a residuum to detect system errors in the system behavior of an aircraft. The device for the residual analysis of a residuum comprises an apparatus to generate the residuum at least dependent on the reference variable and the system output variable, a comparator unit to provide an analytical result by comparing the residuum to a given threshold, a first unit to provide a constant threshold portion, a second unit to provide an adaptive threshold portion at least dependent on the reference value, which can change over time, and a third unit to provide the threshold by linking the constant threshold portion to the adaptive threshold portion.

23 Claims, 5 Drawing Sheets

Related U.S. Application Data (60) Provisional application No. 61/173,239, filed on Apr. 28, 2009.

(51) Int. Cl.
  *G06F 17/10* (2006.01)
  *G05B 17/00* (2006.01)
  *G06F 17/11* (2006.01)

(52) U.S. Cl.
  CPC .......... *G05B 23/0235* (2013.01); *G06F 17/10* (2013.01); *G06F 17/11* (2013.01); *G06F 17/5086* (2013.01); *G06F 17/5095* (2013.01)

(58) Field of Classification Search
  USPC ........................................................ 703/2, 8
  See application file for complete search history.

(56) References Cited

U.S. PATENT DOCUMENTS

| | | | |
|---|---|---|---|
| 5,866,861 A * | 2/1999 | Rajamani ................. | B66B 9/00 187/292 |
| 7,376,499 B2 | 5/2008 | Salman et al. | |
| 7,720,657 B1 * | 5/2010 | Gage .................. | G06F 17/5009 703/8 |
| 7,725,224 B2 | 5/2010 | Goupil | |
| 9,002,678 B1 * | 4/2015 | Cheded .............. | G05B 23/0254 702/183 |
| 2005/0246110 A1 * | 11/2005 | van Dam ........... | G05B 23/0254 702/45 |
| 2006/0074501 A1 * | 4/2006 | Hartman et al. ................ | 700/29 |
| 2007/0032923 A1 * | 2/2007 | Mossman ............ | G05D 1/0858 701/4 |
| 2007/0067078 A1 | 3/2007 | Salman et al. | |
| 2007/0124038 A1 | 5/2007 | Goupil | |
| 2008/0265104 A1 * | 10/2008 | Fabre-Raimbault . | G05D 1/0623 244/76 C |
| 2010/0318336 A1 * | 12/2010 | Falangas ............. | G06F 17/5095 703/8 |
| 2014/0251734 A1 * | 9/2014 | Wang ..................... | B66B 7/043 187/247 |
| 2015/0203215 A1 * | 7/2015 | Falangas .................. | B64F 5/00 703/2 |

FOREIGN PATENT DOCUMENTS

| | | |
|---|---|---|
| EP | 1420153 A2 | 5/2004 |
| EP | 2026158 A2 | 2/2009 |
| RU | 2285943 | 10/2006 |
| RU | 2312389 | 12/2007 |

OTHER PUBLICATIONS

The Stochastic Control of the F-8C Aircraft Using a Multiple Model Adaptive Control (MMAC) Method—Part I: Equilibrium Flight; Michael Athans et al IEEE 1977, 786-780.*

Design and Analysis of Robust Fault Diagnosis Schemes for a Simulated Aircraft Model; M. Benini et al; Hindawi Publishing CorporationJournal of Control Science and Engineering vol. 2008, Article ID 274313, 18 pages.*

Russian Decision to Grant for Application No. 2011146472/08 dated May 27, 2013.

Pons et al., "Interval analysis based learning for fault model identification. Application to control surfaces oscillatory failures," Association for the Advancement of Artificial Intelligence, pp. 1-8 (May 2008).

Lavigne et al., "Oscillatory Failure Case detection for new generation Airbus aircraft: a mode-based challenge," Proceedings of the 47$^{th}$ IEEE Conference on Decision and Control, pp. 1-6 (Dec. 2008).

Goupil et al., "Oscillatory Failure Case detection for new generation Airbus aircraft: a model-based challenge," Control Engineering Practice 18, pp. 1110-1119 (May 2009).

International Search Report for German Application No. DE 10 2009 002 682 A1 dated Nov. 4, 2010.

International Search Report for PCT Application Serial No. PCT/EP2010/055664 dated Nov. 10, 2011.

German Office Action for Application No. 10 2009 061 036.7 dated Jun. 18, 2015.

* cited by examiner

DEVICE AND METHOD FOR THE RESIDUAL ANALYSIS OF A RESIDUUM TO DETECT SYSTEM ERRORS IN THE SYSTEM BEHAVIOUR OF A SYSTEM OF AN AIRCRAFT

CROSS-REFERENCE TO RELATED APPLICATIONS

This application is a continuation of and claims priority to PCT/EP2010/055664 filed Apr. 28, 2010 which claims the benefit of and priority to U.S. Provisional Application No. 61/173,239, filed Apr. 28, 2009 and German Patent Application No. 10 2009 002 682.7 filed Apr. 28, 2009, the entire disclosures of which are herein incorporated by reference.

FIELD OF THE INVENTION

The present invention relates to a device and a method for the residual analysis of a residuum to detect system errors in the system behaviour of a system of an aircraft.

The technical field of the invention relates to analysing a generated residuum to detect system errors, in particular erroneous transients, drift or oscillations, in the system behaviour of a system of an aircraft, for example an electrohydraulic position control system.

If the generated residuum exceeds a predetermined threshold or limit, an error in the system behaviour is detected. System errors of this type in the system behaviour appear in the form of erroneous transients, drift or oscillations in the input/output behaviour of the system.

In this context, the increasing complexity of aircraft control systems, in particular digital aircraft control systems which primarily permit improved flight properties and a plurality of safety and comfort functions with the greatest possible redundancy, is leading to an increased occurrence of sometimes new error scenarios. These include in particular virtually undamped control surface oscillations. OFC (oscillatory failure case) causes are of particular importance in this context, and result from errors in the positioning system itself or propagate into the actuator control circuit of the respective positioning systems from the flight control computers or from the upstream sensor system for detecting flight-mechanical proper motion.

In this context, the plurality of conceivable OFC scenarios includes errors in data processing and signal processing components, software errors, mechanical defects, for example in the servo valve assembly, or failures of individual electronic modules on the lowest circuit level, for example in the voltage-current converter.

Further error scenarios can result from interactions between the individual system components of the actuator control circuit or of the digital flight control system.

For detecting system errors of this type, in a model-based diagnosis approach, it is necessary to generate the residuum to identify an error-based deviation of the actual system behaviour from the nominal, error-free system behaviour. For this purpose, US 2007/0124038 A1 discloses a solution by means of applying a parallel model to the estimation of a piston position, corresponding through a kinematic relationship to the position of the control surface, of the position control system of the aircraft.

For estimating the piston position of the actual electrohydraulic position control system, the approach of a detailed non-linear or a simplified linear parallel model is provided, and is shown in FIG. 2 of US 2007/0124038 A1. In this context, the unit provided with reference numeral 19 in FIG. 2 represents the parallel model which comprises the detailed non-linear representation of the actual system dynamics or a simplified linear description. The temporally variable reference default—denoted by reference numeral 20—for the actuator control circuit is provided as the sole input signal for the parallel model 19, and is impressed by the flight control computer. The sole output signal of the parallel model 19 is denoted by reference numeral 29 and describes the estimated temporally variable actuator piston position.

Figure 1:
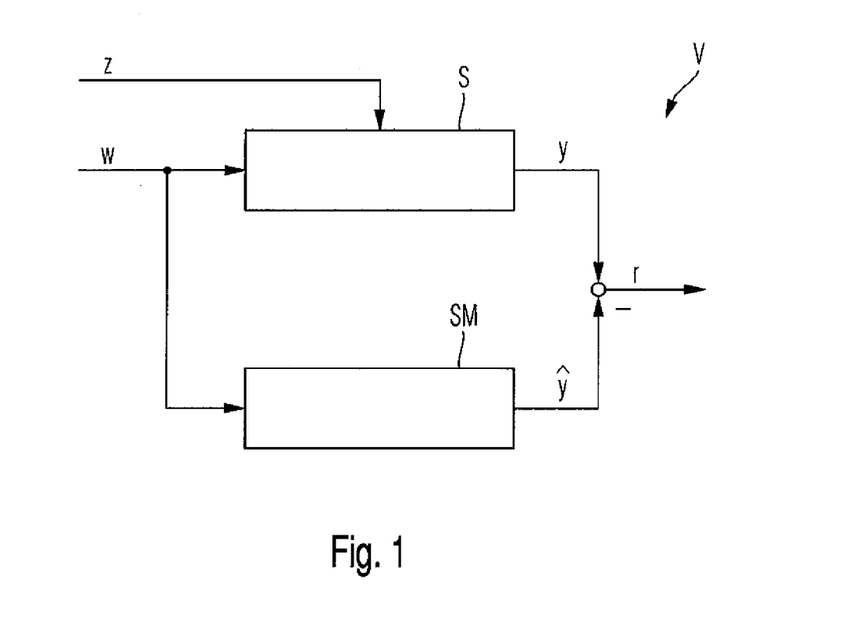
FIG. 1 is a schematic block diagram of an embodiment of a conventional apparatus for generating a residuum to detect system errors of a system of an aircraft.

In this connection, FIG. 1 of the present application shows a schematic block diagram of a conventional apparatus V for generating a residuum r.

This conventional apparatus V of FIG. 1 corresponds to a generalised drawing in FIG. 4 of US 2007/0124038 A1, so as to be better able to demonstrate the drawbacks occurring in the known technique.

Referring to FIG. 1, reference symbol z denotes a disturbance variable which represents external disturbances to the system S.

The system S has the reference variable was an input variable and outputs the system output variable y. The system S is for example an actual electrohydraulic position control system, and the system output variable y corresponds to a measured displacement of the actuator piston of the position control system. To provide an estimated system output variable $\hat{y}$, a system model SM is arranged parallel to the system S.

The core of the estimation method disclosed in US 2007/0124038 is basically the parallel system model or process model, which optimally approximates the initial values of the process or system and the parameterisation thereof in the form of a mathematical description. The identical input signal for the system S, the reference variable or reference default w, is the sole input signal of the system model SM. The estimated system output variable $\hat{y}$ of the system model SM results according to the initial values selected and the parameterised system dynamics of the defined system model. To generate the residuum r, the difference is taken between the temporally variable system output signal y and the estimated system output signal $\hat{y}$ of the system model SM. The residuum r is used to identify a system error if a predefined threshold is exceeded.

When the solution sketched in FIG. 1 and known from US 2007/0124038 A1 is applied to the specific task of identifying erroneous oscillations, drift and transients of an electrohydraulic position control system, the following problems may occur: setting a robust yet highly sensitive detection threshold for the residuum r is not sufficient, since external disturbances, denoted by reference symbol z, may occur, and these act on the system S but are not reproduced by the system model SM. In an electrohydraulic position control system, these external disturbances result in particular from air forces which act on the driven control surface during flight and mechanically load the control system, for example as a result of transient flows due to one-off events such as gusts, harmonic disturbances due to periodic shedding of vortices, effects stemming from the flexibility of the surrounding structure, or stochastic disturbances, in particular in the form of process noise due to the aerodynamic effect of turbulence. A further reason for the insufficient opportunity to set the detection threshold is the constant superposition of measuring noise due to the instrumented sensor equipment, for example the position pick-up on the actuator piston rod, on the measured actuator position acting as the system output variable y.

Further, in the presence of disturbances, highly dynamic changes in the reference variable w result in very rapid short-term growth of the residuum r.

Furthermore, the process or the system S changes as a result of changes in parameters or constraints, for example flight speed, flight altitude, angle of incidence and angle of yaw, temperature, properties of the hydraulic medium of the actuator and the like, during operation or flight. These changes affect the response of the system S and thus the inherent dynamics of the system S. They are not reproduced by the parallel process model or system model SM.

Further, in practical applications, the initial values of the process or system S can only be approximated by a model. Deviations initiated in this manner in the system response of the system model SM, as well as the effect of neglected and unknown dynamics, remain uncorrected in the solution known from US 2007/0124038.

This disadvantageously leads to a signal component, in the residuum, which makes it much more difficult, without additional measures, to set the threshold for error detection very sensitively without limiting the monitored frequency band.

US 2007/0124038 A1 (FIG. 2), provides the subtractor 21 for generating the residuum by taking the difference between the temporally variable values of the measured actuator piston position 22 and the output variable 29 of the parallel model. The output signal 24 of said subtractor corresponds to the residuum formed. Further, the unit provided with reference numeral 23 represents an analysis module for analysing the residuum for error detection.

The analysis module 23 compares the residuum 24 with a predefined threshold and counts each time this threshold is exceeded. After the predetermined threshold is counted as having been exceeded a certain number of times, an oscillatory error is established, and an output signal 26 is set to a positive logical value to indicate this error.

To achieve a particular quality, the analysis module 23 consists of a serial connection of a frequency-selective filter bank, which is the unit having reference numeral 27, and a downstream comparator stage, which is the unit having reference numeral 25, for each individual frequency band of the residuum 24. The frequency-selective filter bank 27 consists of a parallel circuit of band pass filters for spectral separation of the residuum 24 into predetermined frequency bands. In this context, reference numeral 28 denotes a vector of the spectral components of the residuum 24 in the frequency bands established by the frequency-selective filter bank 27.

For this purpose, the comparator bank 25 comprises a separate channel for each component of the vector 28, in which the respective components are compared with a predefined threshold. In each channel, a counter notes if a threshold has been exceeded. If the number of counted excesses in a channel rises above a previously determined limit, the oscillatory error is established and displayed by way of the output signal 28.

When this solution known from US 2007/0124038 A1 is applied to the specific task of detecting system errors of an electrohydraulic position control system of an aircraft, the following problems may occur: setting a robust yet highly sensitive detection threshold for the residuum is not sufficient, and so only a limited quality of the monitoring function of the position control system is achieved. One reason for this is that, inter alia, highly dynamic changes in the reference variable or reference default in the presence of disturbances always cause a very rapid and short-term growth of the residuum. These changes can result in particular from operation in a turbulent atmosphere, from the response properties of flexible structures, or from periodic shedding of vortices. Further, inherent measuring noise of the system can additionally reinforce these detrimental effects. So as not to trigger continuous error alarms in the associated frequency bands, the detection thresholds have to be increased accordingly, and if applicable the number of required operating cycles has to be increased. When detecting steady-state vibrations resulting from system errors, this leads to greatly reduced sensitivity and further to an increased detection time for the analysis module. This applies in particular to system errors in which an oscillatory component is superposed on a low-frequency, nominal system output signal.

A further reason for the limited quality of the monitoring function of the position control system is the crosstalk between adjacent frequency ranges, since precise separation is technically difficult to achieve. This crosstalk can trigger multiple error alarms if the thresholds are different.

Further, uncertainty in establishing the boundaries of the higher frequency bands in combination with corresponding fixed thresholds can result in particular from the structural dynamic response properties. This has a direct detrimental effect on the quality to be achieved in error recognition in the higher frequency range. Applying the counting method known from US 2007/0124038 A1 limits the error detection to the recognition of oscillatory control system errors. The possibility of an extension to other error scenarios, such as transients or creep, is fundamentally excluded by the method. For the monitor designs of modern control systems, this disadvantageously necessitates parallel setup and instrumentation of various specific devices for error recognition. Overall, the arrangement proposed in US 2007/0124038 A1 for residual analysis makes it considerably more difficult to set the threshold for broadband error detection sensitively without limiting the monitored frequency band.

SUMMARY OF THE INVENTION

Accordingly, it is an object of the present invention to provide a residual analysis of a residuum to detect system errors, in particular erroneous transients, drift or oscillations, in the system behaviour of a system of an aircraft, which does not have the above-mentioned drawbacks.

Accordingly, a device is proposed for the residual analysis of a residuum to detect system errors of a system which receives a temporally variable reference value and a disturbance variable, which represents external disturbances, as inputs, and outputs a system output variable, the device comprising:
- an apparatus for generating the residuum at least as a function of the reference variable and the system output variable;
- a comparator unit for providing an analysis result by comparing the residuum with a provided threshold;
- a first unit for providing a constant threshold component;
- a second unit for providing an adaptive threshold component at least as a function of the temporally variable reference value; and
- a third unit for providing the threshold by linking the constant threshold component to the adaptive threshold component.

Each unit, the first to third unit and the comparator unit, can be implemented in hardware or in software. In a hardware implementation, the respective unit may be formed as an apparatus, for example a computer or microprocessor, as a device, or as part of a system, for example a computer system. In a software implementation, the respective unit may be formed as a computer program product, as a function, as a routine, as part of a program code or as an executable object.

Furthermore, an aircraft is proposed comprising at least one device as disclosed above.

Further, a method is proposed for the residual analysis of a residuum to detect system errors in the system behaviour of a system, the system receiving a temporally variable reference value and a disturbance variable, which represents external disturbances, as inputs, and outputting a system output variable, the method having the following steps:
  generating a residuum at least as a function of the reference variable and the system output variable;
  providing a constant threshold component;
  providing an adaptive threshold component at least as a function of the temporally variable reference value; and
  providing a threshold by linking the constant threshold component to the adaptive threshold component; and
  comparing the residuum with the provided threshold to provide an analysis result.

Further, a computer program product is proposed which causes a method as disclosed above, for the residual analysis of a residuum to detect system errors in the system behaviour of a system, to be carried out on a program-controlled device.

An advantage of the present invention is the robust analysis of a residuum, by means of which the presence of system errors, in particular erroneous transients, creep, steady-state vibrations or oscillations, can be detected in a system of an aircraft, in particular an electrohydraulic position control system.

It is thus possible according to the invention to detect system errors as denoted above, and in particular to prevent incorrect indications through the use according to the invention of the adaptive detection threshold, in a very robust manner.

This quality is demonstrated in tests with real hardware-in-the-loop position control systems, the results of which are disclosed in Sachs, Helge: "Fault Investigation and Robust Failure Detection of Oscillatory Aircraft Actuation Systems Using Analytical Redundancy", Hamburg, Hamburg University of Technology, Aircraft Systems Engineering M-7, PhD thesis.

Thus, according to the invention, highly dynamic changes in the reference default or reference variable are reproduced directly by the threshold adaptation by way of the adaptive threshold component. In this way, dynamic system responses to disturbances, which may result from operating in a turbulent atmosphere, from the response properties of flexible structures or from periodic shedding of vortices, are also captured. In particular, in this context reliable and rapid detection of system errors in which an oscillatory component is superposed on a low-frequency nominal system output signal is possible according to the invention.

Furthermore, the expected inherent measuring noise of the system is taken into account separately by way of the constant threshold component, which is preferably set to a minimum value.

Because of the direct processing of the effect of the temporally variable reference default, according to the invention, it is no longer necessary to reproduce the amplitudes resulting from nominal operation by way of the detection thresholds. In this way, for resulting error amplitudes, a minimal error threshold restricted only by the process instrumentation can be applied over the whole spectral range.

In addition, by eliminating the counting method known from US 2007/0124038 A1, it is possible according to the invention to reduce the confirmation times considerably or to set them to zero. In this way the total detection time is reduced greatly, in particular for error states with steady-state oscillations having long periods.

Further, eliminating the conventional counting methods makes it possible to detect system errors which do not lead to vibrations in particular of the actuator piston position or control surface. Consequently, system errors resulting from transients and creep can also be detected. Thus, the instrumentation of various specific devices for error detection can be reduced greatly.

An object of the present invention is to provide a residuum generation for the detection of erroneous transients, drift or oscillations in the system behaviour of a system of an aircraft which does not have the above-mentioned drawbacks.

Accordingly, an apparatus is proposed for generating a residuum for detecting erroneous transients, drift or oscillations in the system behaviour of a system of an aircraft, which system receives a reference default and a disturbance variable, which reproduces external disturbances, as inputs, and outputs a system output variable, the apparatus comprising:
  a first means comprising a system model for reproducing the system to be monitored, which receives the reference variable, an observer feedback variable and a disturbance model variable as inputs, and outputs as a function thereof an estimated system output variable;
  a second means for forming a residuum from the difference between the system output variable and the estimated system output variable;
  a third means comprising an observer feedback, which receives the residuum as an input, and outputs as a function thereof the observer feedback variable for dynamic correction of the system model, in such a way that the estimated system output variable follows the system output variable; and
  a fourth means comprising a disturbance model, which receives the residuum as an input, and outputs as a function thereof the disturbance model variable for reproducing the effects of the external disturbances on the system model.

Each means, the first to fourth means, can be implemented in hardware or in software. In a hardware implementation, the respective means may be formed as an apparatus, for example a computer or microprocessor, as a device, or as part of a system, for example a computer system. In a software implementation, the respective means may be formed as a computer program product, as a function, as a routine, as part of a program code or as an executable object.

Furthermore, an aircraft is proposed comprising at least one apparatus as disclosed above.

Further, a method is proposed for generating a residuum for detecting erroneous transients, drift or oscillations in the system behaviour of a system of an aircraft. The system receives a reference default and a disturbance variable, which reproduces external disturbances, as inputs, and outputs a system output variable.

The method according to the invention has the following steps:
  providing a system model for reproducing the system to be monitored, which receives the reference variable, an observer feedback variable and a disturbance model variable as inputs, and outputs as a function thereof an estimated system output variable;

forming a residuum from the difference between the system output variable and the estimated system output variable;

providing an observer feedback, which receives the residuum as an input, and outputs as a function thereof the observer feedback variable for dynamic correction of the system model, in such a way that the estimated system output variable follows the system output variable; and providing a disturbance model, which receives the residuum as an input, and outputs as a function thereof the disturbance model variable for reproducing the effects of the external disturbances on the system model.

Further, a computer program product is proposed which causes a method as disclosed above, for generating a residuum for detecting erroneous transients, drift or oscillations in the system behaviour of a system of an aircraft, to be carried out on a program-controlled device.

The first to fourth means form in particular a disturbance observer unit or a disturbance observer.

The disturbance observer according to the invention forces a following behaviour of the system model in relation to the estimated system output variable, for example the piston position of the position control system. This is achieved by feeding the residuum back into the internal states of the system model via the observer feedback. To approximate disturbances to the real process or the real system, in particular as a result of dynamic air loads and measuring noise for the system model, the disturbance model is set up parallel to the observer feedback. The approximated or estimated disturbance effect, which according to the invention is reproduced as a disturbance model variable, is also fed back into the internal states of the system model. Thus, alongside the following behaviour, an indirect effect of the external disturbances of the system is additionally reproduced in the estimated system output variable or in the disturbance observer output.

An advantage of the present invention is the robust generation of a residuum by means of which the presence of an error, in particular in the form of erroneous transients, drift, creep or oscillations, can be detected in a system of an aircraft. The analysis is subsequently carried out by comparing the residuum with a predetermined threshold.

With the solution according to the invention, it is possible to set robust and highly sensitive detection thresholds for the residuum, and this is demonstrated in tests with real hardware-in-the-loop position control systems, the results of which are disclosed in Sachs, Helge: "Fault Investigation and Robust Failure Detection of Oscillatory Aircraft Actuation Systems Using Analytical Redundancy", Hamburg, Hamburg University of Technology, Aircraft Systems Engineering M-7, PhD thesis.

Thus, external disturbances which act on the process or the system are reproduced by the disturbance observer according to the invention as an approximation. External disturbances or process disturbances of this type basically result from air forces which act on the driven control surface during operation, in particular as transient disturbances due to one-off events such as gusts, harmonic disturbances due to periodic shedding of vortices, effects stemming from the flexibility of the surrounding structure, or stochastic disturbances such as turbulence, and according to the invention do not bring about a significant effect on the residuum.

Furthermore, permanent superposition of measuring noise (for example expressed by the signal-noise ratio of the position pick-ups on the actuator piston rod) on the measured actuator position as a system output variable has no significant effect on the generated residuum.

As stated above, the system or process changes as a result of changes to parameters or constraints during operation. Examples of these variable parameters are flight speed, flight altitude, angle of incidence and angle of yaw, temperature, properties of the hydraulic medium of the actuator and the like. These changes affect the response properties and the inherent dynamics of the system. They are also reproduced by the disturbance observer according to the invention via the forced following behaviour and thus do not become visible in the residuum.

Different initial values in the system and in the system model are also minimised by means of the observer feedback. They thus have no further effects on the residuum generated according to the invention.

If further measurement variables of the system are available or can be described reliably in advance, the system model can be reduced by these elements. The measurable variables are provided to the disturbance observer as additional input variables. They advantageously increase the quality of the estimated system output variable of the disturbance observer and further minimise the residuum.

If parts of the process or system are fixedly determined, these are extracted from the disturbance observer. In this case, the reduced disturbance observer can be reduced to the partial system or partial process of the dynamic effects which cannot be measured directly and/or are reliable. Reducing the complete disturbance observer to a reduced disturbance observer which is integrated into the fixed system equations leads to a further increase in robustness and thus to acceleration of the runtime properties of the proposed method.

Advantageous configurations and improvements of the invention are found in the dependent claims.

In a preferred development, the first unit is set up to provide the constant threshold component as a function of an expected inherent measuring noise of the system.

In a further preferred development, the first unit is set up to set the constant threshold component to a minimum value as a function of the expected inherent measuring noise of the system.

In a further preferred development, the apparatus for generating the residuum has at least one system model for reproducing the system to be monitored.

In a further preferred development, the apparatus for generating the residuum has:

a first means comprising a system model for reproducing the system to be monitored, which receives the reference variable, an observer feedback variable and a disturbance model variable as inputs, and outputs as a function thereof an estimated system output variable;

a second means for forming a residuum from the difference between the system output variable and the estimated system output variable;

a third means comprising an observer feedback, which receives the residuum as an input, and outputs as a function thereof the observer feedback variable for dynamic correction of the system model, in such a way that the estimated system output variable follows the system output variable; and a fourth means comprising a disturbance model, which receives the residuum as an input, and outputs as a function thereof the disturbance model variable for reproducing the effects of the external disturbances on the system model.

As regards connecting the concept for generating the adaptive threshold with the reduced disturbance observer, it has been demonstrated in tests with real hardware-in-the-loop position control systems that the resulting increase in the quality of error detection is considerable. In this context, the sensitivity is increased by 55 to 90% by reducing the detection thresholds. Further, the time for a reconfiguration of the system after a powered runaway event, i.e. when the control surface moves into its end position at maximum speed in an uncontrolled manner, is only 1/15 of the total time interval prescribed for the reconfiguration. Further, the resulting dynamic structural loads are greatly reduced.

In a further preferred development, the second unit is set up to provide the adaptive threshold component as a function of the temporally variable reference value and at least one state variable estimated using the system model.

In a further preferred development, the second unit is set up to provide the adaptive threshold component as a function of the temporally variable reference value and at least one provided measurement variable of the system and/or at least one state variable estimated using the system model.

In a further preferred development, the third unit is set up to add the constant threshold component to the adaptive threshold component to provide the threshold.

In a further preferred development, the comparator unit sets the analysis result to a positive logical value to indicate a system error if the provided residuum is greater than the provided threshold.

In a further preferred development, a fourth unit is provided, and actuates the comparator unit after a particular confirmation period has elapsed.

In a further preferred development, a system error is reproduced as an erroneous transient, a drift or an oscillation.

BRIEF DESCRIPTION OF THE DRAWINGS

In the following, the invention is described in greater detail by way of embodiments with reference to the appended figures of the drawings.

In the figures.

DESCRIPTION OF EXEMPLARY EMBODIMENTS

In the figures, like reference numerals denote like or functionally equivalent components unless stated otherwise.

Figure 2:
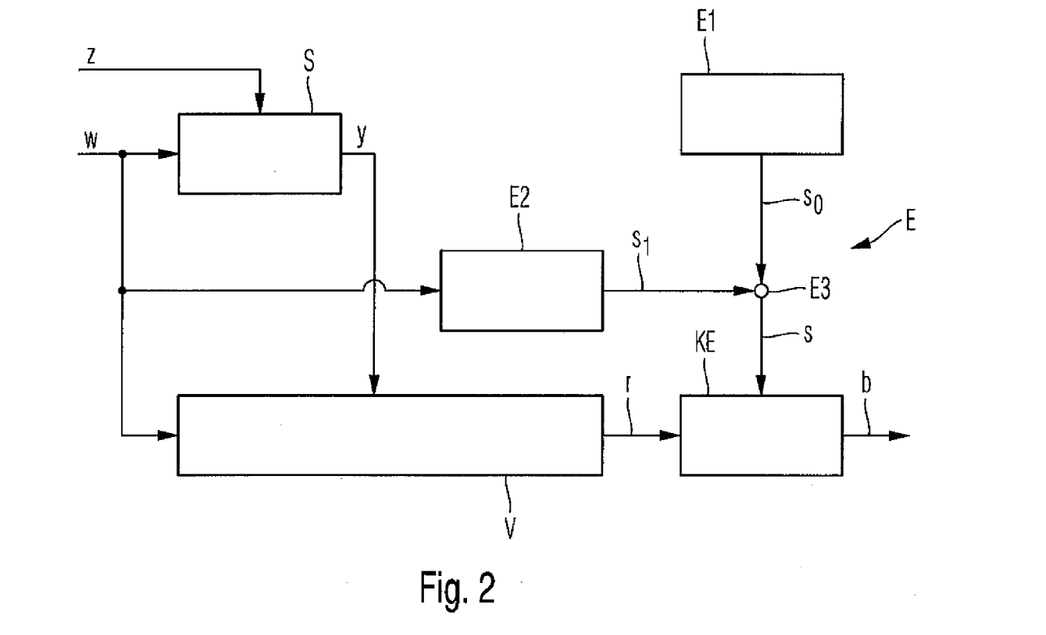
FIG. 2 is a schematic block diagram of a first embodiment of a device for the residual analysis of a residuum to detect system errors in the system behaviour of a system of an aircraft.

FIG. 2 is a schematic block diagram of a first embodiment of a device E for the residual analysis of a residuum r to detect system errors in the system behaviour of a system S of an aircraft. The system S receives a temporally variable reference value w and a disturbance variable z, which reproduces external disturbances, as input variables. As a function thereof, the system S outputs a system output variable y. The device E for residual analysis has at least one apparatus V for generating the residuum r, a comparator unit KE, a first unit E1, a second unit E2, and a third unit E3.

The apparatus V is adapted for generating the residuum r, the apparatus V generating the residuum r at least as a function of the reference variable w and the system output variable y.

Figure 4:
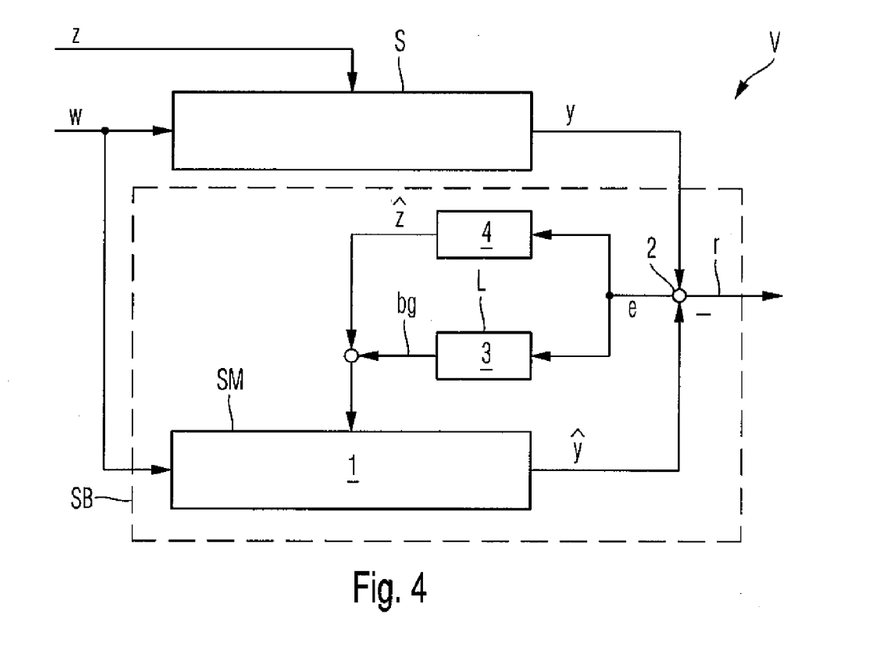
FIG. 4 is a schematic block diagram of a first embodiment of an apparatus for generating a residuum to detect system errors in the system behaviour of a system of an aircraft.
Figure 5:
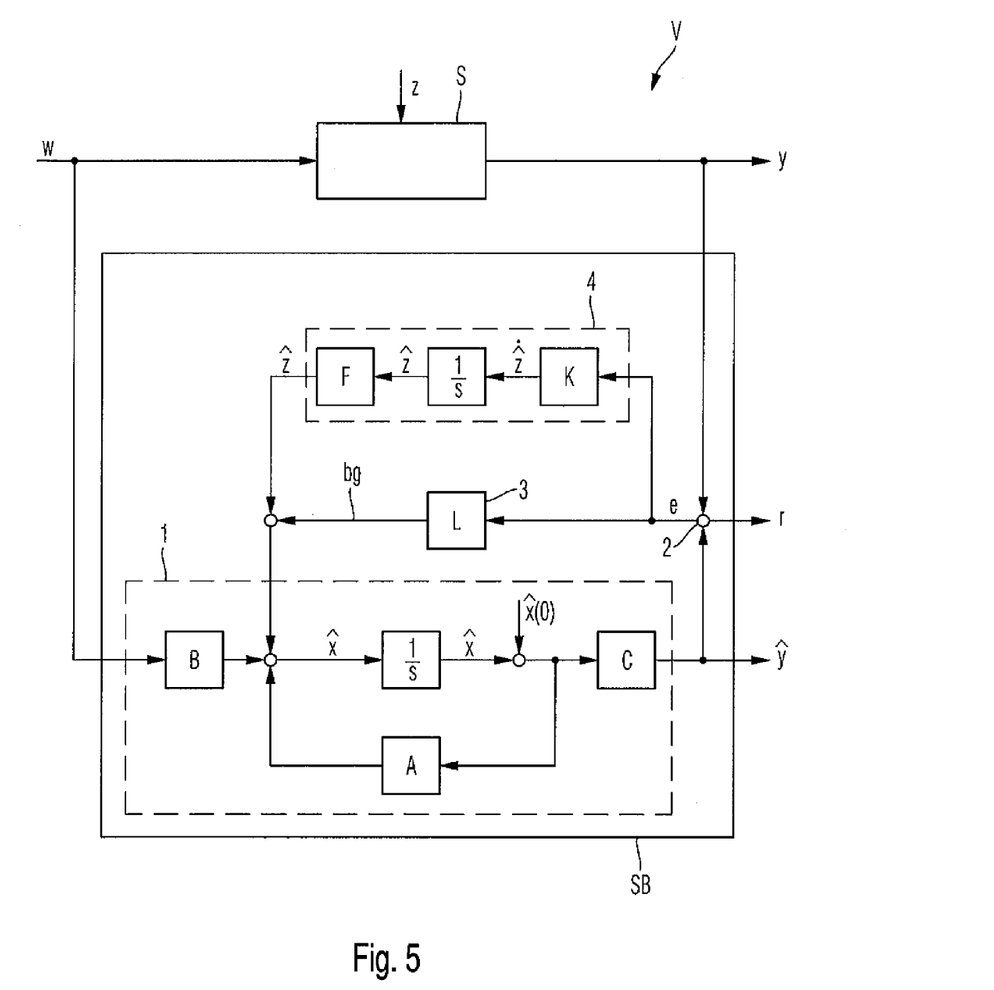
FIG. 5 is a schematic block diagram of a second embodiment of an apparatus for generating a residuum to detect system errors in the system behaviour of a system of an aircraft.

The apparatus V is for example formed in accordance with one of the embodiments of FIG. 4 or 5.

The comparator unit KE provides an analysis result b using a comparison of the residuum r with a provided threshold s.

The units E1 to E3 are provided for providing the threshold s.

In this context, the first unit E1 is set up to provide a constant threshold component s0.

The second unit E2 is set up to provide an adaptive threshold component s1 at least as a function of the temporally variable reference value w.

Further, the third unit E3 is set up to provide the threshold s by linking the constant threshold component s0 to the adaptive threshold component s1. In particular, the third unit E3 adds the constant threshold s0 to the adaptive threshold s1 to form the threshold s.

The comparator unit KE sets the analysis result b to a positive logical value to indicate a system error if the provided residuum r is greater than the provided threshold s. Alternatively, the analysis result b may also be formed as a signal, for example as a continuous signal, which is set up to indicate the two possible states (r>s and r≤s).

Figure 3:
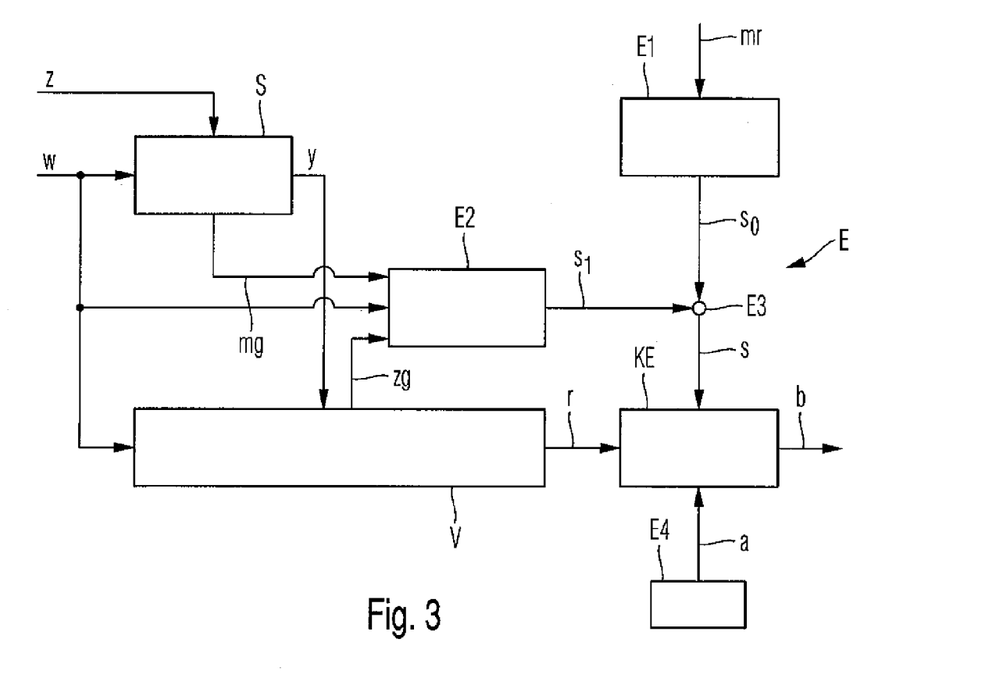
FIG. 3 is a schematic block diagram of a second embodiment of a device for the residual analysis of a residuum to detect system errors in the system behaviour of a system of an aircraft.

FIG. 3 shows a second embodiment of a device E according to the invention for the residual analysis of a residuum r to detect system errors in the system behaviour of a system S of an aircraft.

The second embodiment according to FIG. 3 has all the features of the first embodiment according to FIG. 2, and therefore to avoid repetition these will not be explained again.

In the second embodiment of the device E according to the invention, the first unit E1 is set up to provide the constant threshold component s0 as a function of an expected inherent measuring noise mr of the system S.

In this context, the first unit E1 preferably sets the constant threshold s0 to a minimum value.

Further, according to FIG. 3, the second unit E2 is set up to provide the adaptive threshold s1 as a function of the temporally variable reference value w, at least one provided measurement variable mg of the system S and/or a state variable zg estimated using a system model SM of the apparatus V.

Further, the apparatus E preferably comprises a fourth unit E4, which is set up to actuate the comparator unit KE after a predetermined confirmation time has elapsed. The fourth unit E4 controls the comparator KE for this purpose, preferably by means of an actuation signal a.

Examples of the apparatus V for generating the residuum r are shown in FIGS. 4 and 5.

FIG. 4 is therefore a schematic block diagram of an embodiment of the apparatus V according to the invention for generating a residuum to detect system errors, in particular erroneous transients, drift or oscillations, in the system behaviour of a system S of an aircraft.

The apparatus V, for generating a residuum to detect erroneous transients, drift or oscillations in the system behaviour of a system S of an aircraft, has a first means 1, a second means 2, a third means 3 and a fourth means 4. The first to fourth means 1-4 form a disturbance observer unit SB. The system S receives a reference default w and a disturbance variable z, which reproduces external disturbances to the system S, as inputs. As a function thereof, the system outputs a system output position y. The system S is for example an electrohydraulic position control system of the aircraft, in which case the system output variable y is a measured displacement of the actuator piston of the position control system S.

The first means 1 has a system model SM for reproducing the system S to be monitored. The first means 1 receives the reference variable w, an observer feedback variable b and a disturbance model variable $\hat{z}$ as inputs. As a function thereof, the first means 1 outputs an estimated system output variable $\hat{y}$ (FIG. 4).

The second means 2 is set up to form a residuum r from the difference between the system output variable y and the estimated system output variable $\hat{y}$. The second means 2 is for example formed as a subtractor.

The third means 3 is formed as an observer feedback L. The third means 3 receives the residuum r as an input, and outputs the observer feedback variable bg for dynamic correction of the system model SM as a function of the received residuum r, in such a way that the estimated system output variable $\hat{y}$ follows the system output variable y.

Furthermore, the fourth means 4 is provided with a disturbance model ZM, which receives the residuum r as an input and outputs the disturbance model variable $\hat{z}$ as a function thereof to reproduce the effects of the external disturbances on the system model SM.

The observer feedback L is in particular set up for dynamic correction of the internal states of the system model SM, in such a way that the estimated system output variable $\hat{y}$ follows the system output variable y, a decay of an initial disturbance and a following behaviour of the external disturbances being provided by weighting of the residuum r and feedback into the system model SM.

FIG. 5 shows a second embodiment of an apparatus V according to the invention for generating a residuum r to detect system errors, in particular erroneous transients, drift or oscillations, in the system behaviour of a system S of an aircraft.

The second embodiment according to FIG. 5 has all the features of the first embodiment of FIG. 4, and therefore to avoid repetition these will not be explained again.

In the second embodiment of the apparatus V according to the invention, the disturbance observer unit SB has an observer feedback matrix L to form the observer feedback. In this context, the coefficients of the observer feedback matrix L are determined via a state controller design. The state controller design is for example formed by a pole default, by an optimum controller design, by a design method for designing robust feedbacks, by linear quadratic estimators (LQEs) or by non-linear approaches.

Further, the disturbance model variable $\hat{z}$ or estimated disturbance variable $\hat{z}$ is formed as a dynamic disturbance model variable $\hat{z}$ which is formed using a linear combination of artificial system states.

In this context, the dynamic disturbance model variable $\hat{z}$ is preferably formed using a linear combination of a tuning matrix K, an integrator 1/s and a disturbance variable matrix F. The tuning matrix K receives the residuum r, and the disturbance variable matrix F outputs the disturbance model variable $\hat{z}$. The integrator 1/s is arranged between the tuning matrix K and the disturbance variable matrix F. By analogy with the generalised state vector x of the real system S, $\hat{x}$ denotes the system states of the linear system model SM, which result from temporal changes in the system states $\hat{x}$ by way of integration by the integrator 1/s. These are the sum of the disturbance model output variable $\hat{z}$, the observer feedback variable bg, a reference variable w weighted by the input matrix B, and the system states $\hat{x}$ fed back via the system matrix A. Multiplying the dynamic system model states $\hat{x}$ by the output matrix C results in the estimated system output variable $\hat{y}$. $\hat{x}(0)$ describes the initial value of the linear system model SM.

Figure 6:
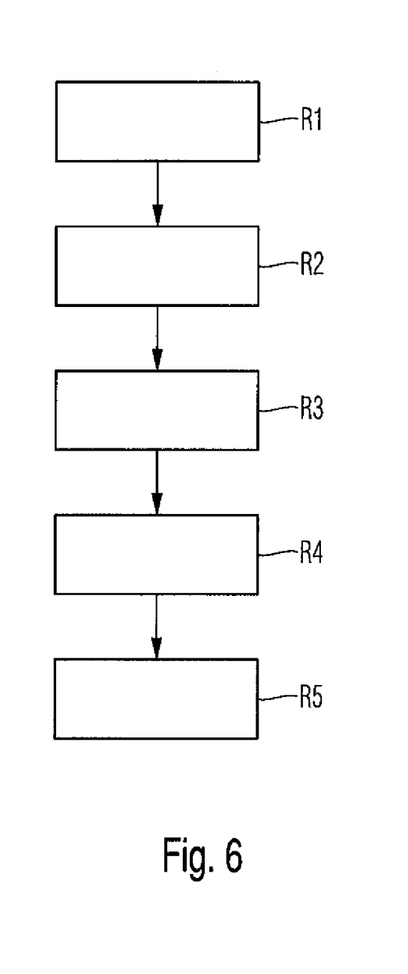
FIG. 6 is a schematic flow chart of an embodiment of a method for the residual analysis of a residuum to detect system errors in the system behaviour of a system of an aircraft.

FIG. 6 is a schematic flow chart of an embodiment of a method for the residual analysis of a residuum r to detect system errors in the system behaviour of a system S of an aircraft.

In the following, the method according to the invention will be disclosed by way of the block diagram of FIG. 6 with reference to the block diagram of FIG. 2. The embodiment of the method according to the invention in accordance with FIG. 6 has the following method steps R1 to R5:

Method Step R1:

A residuum r is generated at least as a function of the reference variable w and the system output variable y.

Method Step R2:

A constant threshold component s0 is provided.

Method Step R3:

An adaptive threshold component s1 is provided at least as a function of the temporally variable reference value w.

Method Step R4:

A threshold s is provided by linking, in particular by adding, the constant threshold component s0 to the adaptive threshold component s1.

Method Step R5:

The residuum r is compared with the provided threshold s to provide an analysis result b. If the residuum r is above the provided threshold s, a system error in the system S is established.

Figure 7:
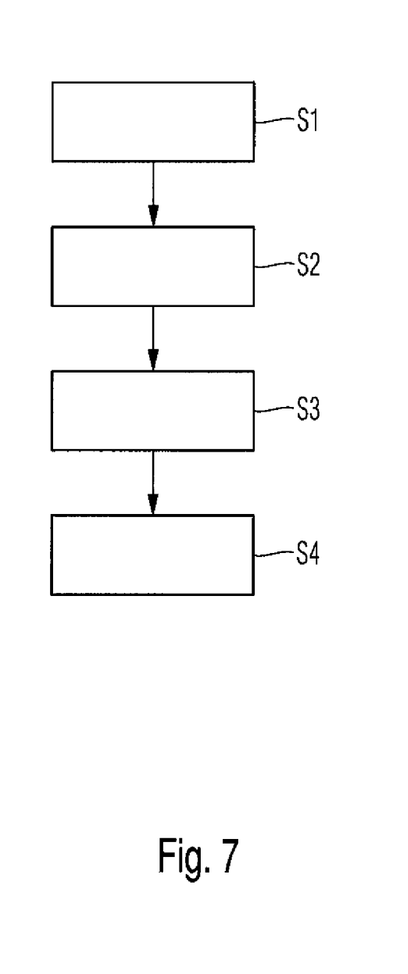
FIG. 7 is a schematic flow chart of an embodiment of a method for generating a residuum to detect system errors in the system behaviour of a system of an aircraft.

FIG. 7 is a schematic flow diagram of an embodiment of the method according to the invention for generating a residuum r for recognising a residuum r for detecting system errors, in particular erroneous transients, drift or oscillations, in the system behaviour of a system S of an aircraft, which system receives a reference variable w and an disturbance variable z, which reproduces eternal disturbances, as inputs, and outputs a system output variable y.

In the following, the method according to the invention is described by way of the block diagram of FIG. 7 with reference to the block diagram of FIG. 4. The embodiment of the method according to the invention in accordance with FIG. 7 has the following method steps S1 to S4:

Method Step S1:

A system model SM is provided for reproducing the system S to be monitored. The system model SM receives the reference variable w, an observer feedback variable bg, and a disturbance model variable $\hat{z}$ as inputs. As a function thereof, the system model SM outputs an estimated system output variable $\hat{y}$.

Method Step S2:

A residuum r is formed from the difference between the system output variable y and the estimated system output variable $\hat{y}$.

Method Step S3:

An observer feedback L is provided, and receives the residuum r as an input, and outputs the observer feedback variable bg, for dynamic correction of the system model SM, as a function thereof, in such a way that the estimated system output variable $\hat{y}$ follows the system output variable y.

Method Step S4:

A disturbance model ZM is provided, and receives the residuum r as an input, and outputs the disturbance model variable $\hat{z}$, for reproducing the effects of external disturbances on the system model SM, as a function thereof.

Preferably, when it is established that a further measurement variable of the system S is available, the set of estimated system variables in the system model SM are reduced by this extended measurement variable, and this further measurement variable is supplied directly to the system model SM as a further input variable.

FIGS. 8 to 12 are schematic time-dependency diagrams to illustrate the residual analysis according to the invention of a residuum r for detecting system errors FC in the system behaviour of a system S of an aircraft.

The example of FIGS. 8 to 12 is based on a position control system as the system S, comprising a first actuator, denoted as the system output signal y1 based on the displacement of the actuator piston of the first actuator, and a redundant second actuator, denoted as the system output signal y2 based on the displacement of the actuator piston of the second actuator.

Figure 8:
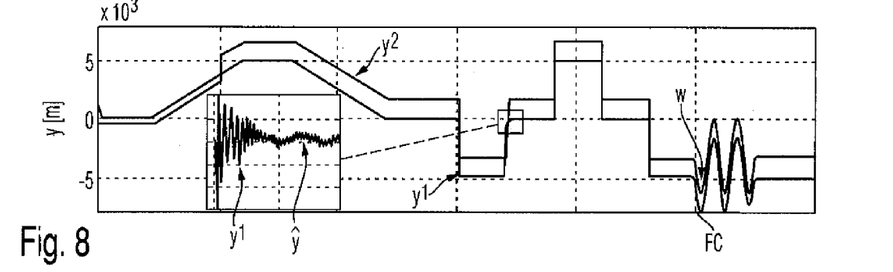
FIG. 8-12 are schematic time-dependency diagrams to illustrate the residual analysis according to the invention of a residuum for detecting system errors in the system behaviour of a system of an aircraft.
Figure 9:
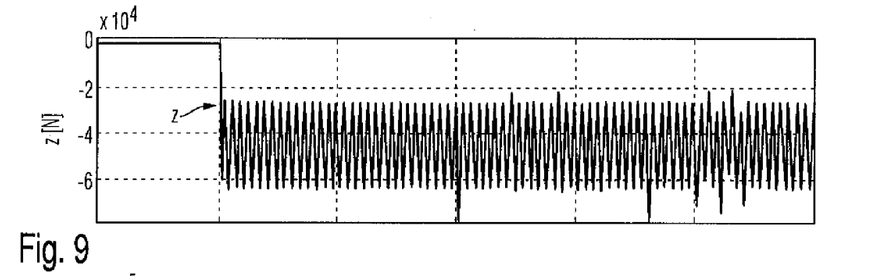
Figure 10:
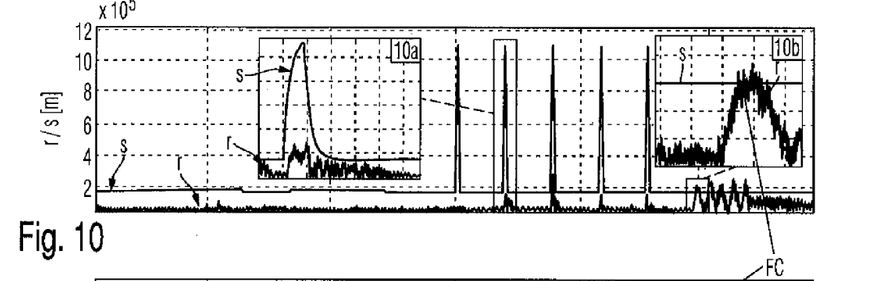
Figure 11:
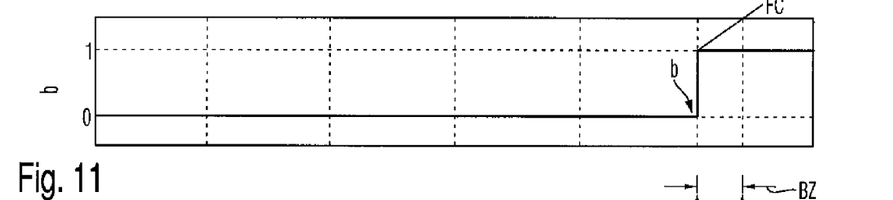
Figure 12:
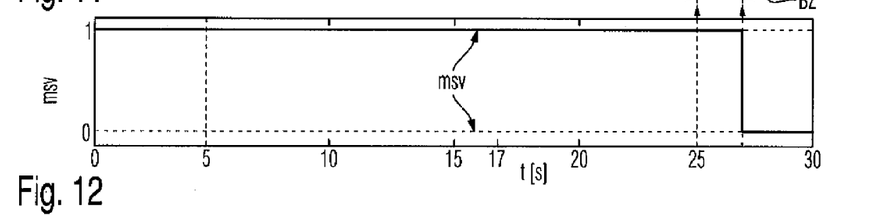

FIG. 8 shows the temporal progression of the system output signals y1 and y2. FIG. 9 further shows the temporal progression of the disturbance z. FIG. 10 shows the temporal progression of the residuum r and of the threshold s according to the invention. Further, FIGS. 11 and 12 show the temporal progression of the output result b and the temporal progression of an actuation signal msv, which is generated as a function of the analysis result b for selecting the actuator 1 or 2.

As stated previously, FIG. 8 shows the temporal progression of the system output signals y1 and y2. At time t=17 s, the system output signals y1 and y2 increase considerably in accordance with the reference variable w.

Further, FIG. 9 shows the temporal progression of the disturbance z, which corresponds to a force with which the control surface, driven by the actuator 1 or 2, of the aircraft is loaded. This force is also referred to as aerodynamic load or air load.

Further, FIG. 10 shows the temporal progression of the residuum r and the threshold s according to the invention. FIG. 10a is a detail from FIG. 10 around time t=17 s, at which the reference variable w and thus the system output variables y1 and y2 jump upwards in FIG. 8. According to the invention, the threshold s is adapted as a function of the reference default w, i.e. the threshold s is adapted as a function of the jump in the reference default w and will therefore itself jump (see FIG. 10a). Thus, according to FIG. 11, no error is detected at time t=17 s, and so b=0 at time t=17 s.

By contrast, at time t=25 s, a system error FC occurs and results in oscillation of the system output signals y1 and y2. Since the reference default w does not change at this time t=25 s, the threshold s is also not adapted. Consequently, at time t=25 s, the residuum r will exceed the provided threshold s. This is shown in detail in FIG. 10b.

Consequently, in accordance with FIG. 11, in this case the analysis result b is switched from 0 to 1, i.e. b=1 at time t=25 s.

In accordance with FIG. 12, after a confirmation time BZ, for example 2s, has elapsed, an actuation signal msv is switched from 1 to 0. This switching indicates a switch from the first actuator to the second actuator. Thus, at time t=27 s, the reconfiguration and thus the switching of the system S from the first actuator to the second actuator is complete.

According to the invention, the confirmation time may also be set to 0, since it is already established at time t=25 s that it is necessary to switch from actuator 1 to actuator 2.

Although the present invention has been disclosed herein by way of preferred embodiments, it is not restricted thereto, but can be modified in numerous ways.

In the following preferred embodiments are explained:

1. A device for the residual analysis of a residuum to detect system errors of a system which receives a temporally variable reference value and a disturbance variable, which represents external disturbances, as inputs, and outputs a system output variable, comprising:

a) an apparatus for generating the residuum at least as a function of the reference variable and the system output variable;

b) a comparator unit for providing an analysis result by comparing the residuum with a provided threshold;

c) a first unit for providing a constant threshold component;

d) a second unit for providing an adaptive threshold component at least as a function of the temporally variable reference value; and e) a third unit for providing the threshold by linking the constant threshold component to the adaptive threshold component.

2. The device according to embodiment 1, wherein the first unit is set up to provide the constant threshold component as a function of an expected inherent measuring noise of the system.

3. The device according to embodiment 2, wherein the first unit is set up to set the constant threshold component to a minimum value as a function of the expected inherent measuring noise of the system.

4. The device according to embodiment 1, wherein the second unit is set up to provide the adaptive threshold component as a function of the temporally variable reference value and at least one provided measurement variable of the system.

5. The device according to embodiment 1, wherein the apparatus for generating the residuum has at least one system model for reproducing the system to be monitored.

6. The device according to embodiment 1, wherein the apparatus for generating the residuum has:

a first means (1) comprising a system model for reproducing the system to be monitored, which receives the reference variable, an observer feedback variable and a disturbance model variable as inputs, and outputs as a function thereof an estimated system output variable;

a second means for forming a residuum from the difference between the system output variable and the estimated system output variable;
a third means comprising an observer feedback, which receives the residuum as an input, and outputs as a function thereof the observer feedback variable for dynamic correction of the system model, in such a way that the estimated system output variable follows the system output variable; and
a fourth means comprising a disturbance model, which receives the residuum as an input, and outputs as a function thereof the disturbance model variable for reproducing the effects of the external disturbances on the system model.

7. The device according to embodiment 5, wherein the second unit is set up to provide the adaptive threshold component as a function of the temporally variable reference value and at least one state variable estimated using the system model.

8. The device according to embodiment 5, wherein the second unit is set up to provide the adaptive threshold component as a function of the temporally variable reference value and at least one provided measurement variable of the system and/or at least one state variable estimated using the system model (SM).

9. The device according to embodiment 1, wherein the third unit is set up to add the constant threshold component to the adaptive threshold component to provide the threshold.

10. The device according to embodiment 1, wherein the comparator unit sets the analysis result to a positive logical value to indicate a system error if the provided residuum is greater than the provided threshold.

11. The device according to embodiment 10, wherein a fourth unit is provided, and actuates the comparator unit after a particular confirmation period has elapsed.

12. The device according to embodiment 1, wherein the system errors comprise erroneous transients, drift or oscillations.

13. An aircraft comprising one or more devices according to embodiment 1.

14. A method for the residual analysis of a residuum for detecting system errors in the system behaviour of a system which receives a temporally variable reference value and a disturbance variable, which reproduces external disturbances, as inputs, and outputs a system output variable, having the steps of:
a) generating a residuum (r) at least as a function of the reference variable and the system output variable;
b) providing a constant threshold component;
c) providing an adaptive threshold component at least as a function of the temporally variable reference value; and
d) providing a threshold by linking the constant threshold component to the adaptive threshold component; and
e) comparing the residuum with the provided threshold to provide an analysis result.

15. An apparatus for generating a residuum for detecting erroneous transients, drift or oscillations in the system behaviour of a system of an aircraft which receives a reference default and a disturbance variable, which reproduces external disturbances, as inputs, and outputs a system output variable, comprising:
a) a first means comprising a system model for reproducing the system to be monitored, which receives the reference variable, an observer feedback variable and a disturbance model variable as inputs, and outputs as a function thereof an estimated system output variable;
b) a second means for forming a residuum from the difference between the system output variable and the estimated system output variable;
c) a third means comprising an observer feedback, which receives the residuum as an input, and outputs as a function thereof the observer feedback variable for dynamic correction of the system model, in such a way that the estimated system output variable follows the system output variable; and
d) a fourth means comprising a disturbance model, which receives the residuum as an input, and outputs as a function thereof the disturbance model variable for reproducing the effects of the external disturbances on the system model.

16. The apparatus according to embodiment 15, wherein the system is an electrohydraulic position control system of the aircraft.

17. The apparatus according to embodiment 16, wherein the system output variable is a measured displacement of the actuator piston of the position control system or the measured control surface position of the aircraft.

18. The apparatus according to embodiment 15, wherein the observer feedback is set up for dynamic correction of the internal states of the system model, in such a way that the estimated system output variable follows the system output variable, a decay of an initial disturbance and a following behaviour of the external disturbances being provided by weighting of the residuum and feedback into the system model.

19. The apparatus according to embodiment 18, wherein the observer feedback comprises an observer feedback matrix.

20. The apparatus according to embodiment 19, wherein coefficients of the observer feedback matrix are determined via a state controller design, in particular via a pole default, an optimum controller design, a design method for designing robust feedbacks, linear quadratic estimators or nonlinear approaches.

21. The apparatus according to embodiment 15 wherein the disturbance model variable is formed as a dynamic disturbance model variable which is formed using a linear combination of artificial system states.

22. The apparatus according to embodiment 21, wherein the dynamic disturbance model variable is formed using a linear combination of a tuning matrix, an integrator and a disturbance variable matrix, the tuning matrix receiving the residuum as an input, and the disturbance variable matrix outputting the disturbance model variable.

23. An aircraft comprising one or more apparatuses according to embodiment 15.

24. A Method for generating a residuum for detecting erroneous transients, drift or oscillations in the system behaviour of a system of an aircraft, which system receives a reference default and a disturbance variable, which reproduces external disturbances, as inputs, and outputs a system output variable, having the steps of:
a) providing a system model for reproducing the system to be monitored, which receives the reference variable, an observer feedback variable and a disturbance model variable as inputs, and outputs as a function thereof an estimated system output variable;
b) forming a residuum from the difference between the system output variable and the estimated system output variable;
c) providing an observer feedback, which receives the residuum as an input, and outputs as a function thereof the observer feedback variable for dynamic correction of the system model, in such a way that the estimated system output variable follows the system output variable; and d) providing a disturbance model, which receives the residuum as an input, and outputs as a function thereof the disturbance model variable for reproducing the effects of the external disturbances on the system model.

25. The method according to embodiment 24, wherein when it is established that a further measurement variable of the system is available, the system model is reduced by this extended measurement variable, and this further measurement variable is supplied directly to the system model as a further input variable.

26. A computer program product which causes a method according to embodiment 24 to be carried out on a program-controlled device.

LIST OF REFERENCE NUMERALS 1 first means
2 second means
3 third means
4 fourth means
a actuation signal
BZ confirmation time
b analysis result
bg observer feedback variable or output signal of the observer feedback
A system matrix of the linear system model SM
B input matrix of the linear system model SM
C output matrix of the linear system model SM
E1 first unit
E2 second unit
E3 third unit
E4 fourth unit
F disturbance variable matrix
KE comparator unit
K tuning matrix
L observer feedback matrix
mg measurement variable
mr measuring noise
R1-R5 method step
r residuum
S system
S1-S4 method step
SB disturbance observer unit
SM system model
FC system error
w reference variable
y system output variable
ŷ estimated system output variable
z disturbance variable
zg state variable
ż disturbance model variable
ZM disturbance model
1/s integrator

The invention claimed is:

1. An apparatus for generating a residuum for detecting erroneous transients, drift or oscillations in behavior of a system of an aircraft, the apparatus comprising:
a computer comprising at least one hardware processor configured to execute a plurality of computing functions, wherein:
a first computing function executed by the processor comprises a system model for reproducing a system of an aircraft to be monitored, which system receives a reference variable, an observer feedback variable and a disturbance model variable as inputs, and outputs, as a function thereof, an estimated system output variable;
a second computing function executed by the processor forms a residuum from a difference between a monitored system output variable of the system and the estimated system output variable;
a third computing function executed by the processor comprises an observer feedback, which receives the residuum as an input, and outputs, as a function thereof, the observer feedback variable for dynamic correction of the system model, in such a way that the estimated system output variable follows the monitored system output variable; and
a fourth computing function executed by the processor comprises a disturbance model, which receives the residuum as an input, and outputs, as a function thereof, the disturbance model variable for reproducing effects of external disturbances on the system model, the disturbance model variable being formed as a dynamic disturbance model variable which is formed using a linear combination of a tuning matrix, an integrator and a disturbance variable matrix, the tuning matrix receiving the residuum as an input, and the disturbance variable matrix outputting the disturbance model variable.

2. The apparatus according to claim 1, wherein the system is an electrohydraulic position control system of the aircraft.

3. The apparatus according to claim 2, wherein the monitored system output variable is a measured displacement of an actuator piston of the position control system or a measured control surface position of the aircraft.

4. The apparatus according to claim 1, wherein the observer feedback is set up for dynamic correction of internal states of the system model, in such a way that the estimated system output variable follows the monitored system output variable, a decay of an initial disturbance and a following behavior of the external disturbances being provided by weighting of the residuum and feedback into the system model.

5. The apparatus according to claim 4, wherein the observer feedback comprises an observer feedback matrix.

6. The apparatus according to claim 5, wherein coefficients of the observer feedback matrix are determined via a state controller design, via a pole default, an optimum controller design, a design method for designing robust feedbacks, linear quadratic estimators (LQEs) or non-linear approaches.

7. An aircraft comprising one or more apparatuses according to claim 1.

8. A method for generating a residuum for detecting erroneous transients, drift or oscillations in the behavior of a system of an aircraft, which system receives a reference default and a disturbance variable, which reproduces external disturbances, as inputs, and outputs a system output variable, having steps of:
a) providing a system model for reproducing the system to be monitored, which receives the reference variable, an observer feedback variable and a disturbance model variable as inputs, and outputs, as a function thereof, an estimated system output variable;
b) forming a residuum from a difference between the system output variable and the estimated system output variable;
c) providing an observer feedback, which receives the residuum as an input, and outputs, as a function thereof, the observer feedback variable for dynamic correction of the system model, in such a way that the estimated system output variable follows the system output variable; and d) providing a disturbance model, which receives the residuum as an input, and outputs, as a function thereof, the disturbance model variable for reproducing effects of the external disturbances on the system model, wherein the disturbance model variable comprising a dynamic disturbance model variable which is formed using a linear combination of a tuning matrix, an integrator and a disturbance variable matrix, the tuning matrix receiving the residuum as an input, and the disturbance variable matrix outputting the disturbance model variable.

9. The method according to claim 8, wherein when it is established that a further measurement variable of the system is available, the system model is reduced by the further measurement variable, and the further measurement variable is supplied directly to the system model as a further input variable.

10. A non-transitory machine-readable storage medium configured to execute the method according to claim 8 to be carried out on a program-controlled device.

11. A device for the residual analysis of a residuum to detect system errors of a system which receives a temporally variable reference value and a disturbance variable, which represents external disturbances, as inputs, and outputs a system output variable, comprising:

a) an apparatus for generating the residuum at least as a function of reference variable and the system output variable;

b) a comparator unit for providing an analysis result by comparing the residuum (r) with a provided threshold (s);

c) a first unit for providing a constant threshold component;

d) a second unit for providing an adaptive threshold component at least as a function of the temporally variable reference value; and e) a third unit for providing the threshold by linking the constant threshold component to the adaptive threshold component, wherein the apparatus for generating the residuum comprises:

a first means comprising a system model for reproducing the system to be monitored, which receives the reference variable, an observer feedback variable and a disturbance model variable as inputs, and outputs, as a function thereof, an estimated system output variable;

a second means for forming a residuum from a difference between the system output variable and the estimated system output variable;

a third means comprising an observer feedback, which receives the residuum as an input, and outputs, as a function thereof, the observer feedback variable for dynamic correction of the system model, in such a way that the estimated system output variable follows the system output variable; and a fourth means comprising a disturbance model, which receives the residuum as an input, and outputs, as a function thereof, the disturbance model variable for reproducing effects of the external disturbances on the system model, the disturbance model variable being formed as a dynamic disturbance model variable which is formed using a linear combination of a tuning matrix, an integrator, and a disturbance variable matrix, the tuning matrix receiving the residuum as an input, and the disturbance variable matrix outputting the disturbance model variable.

12. The device according to claim 11, wherein the first unit is set up to provide the constant threshold component as a function of an expected inherent measuring noise of the system.

13. The device according to claim 12, wherein the first unit is set up to set the constant threshold component to a minimum value as a function of the expected inherent measuring noise of the system.

14. The device according to claim 11, wherein the second unit is set up to provide the adaptive threshold component as a function of the temporally variable reference value and at least one provided measurement variable of the system.

15. The device according to claim 11, wherein the apparatus for generating the residuum has at least one system model for reproducing the system to be monitored.

16. The device according to claim 15, wherein the second unit is set up to provide the adaptive threshold component as a function of the temporally variable reference value and at least one state variable estimated using the system model.

17. The device according to claim 15, wherein the second unit is set up to provide the adaptive threshold component as a function of the temporally variable reference value and at least one provided measurement variable of the system and/or at least one state variable estimated using the system model.

18. The device according to claim 11, wherein the third unit is set up to add the constant threshold component to the adaptive threshold component to provide the threshold.

19. The device according to claim 11, wherein the comparator unit sets the analysis result to a positive logical value to indicate a system error if the provided residuum is greater than the provided threshold.

20. The device according to claim 19, wherein a fourth unit is provided, and actuates the comparator unit after a particular confirmation period has elapsed.

21. The device according to claim 11, wherein the system errors comprise erroneous transients, drift or oscillations.

22. An aircraft comprising one or more devices according to claim 11.

23. A method for residual analysis of a residuum for detecting system errors in behavior of a system which receives a temporally variable reference value and a disturbance variable, which reproduces external disturbances, as inputs, and outputs a system output variable, the method having steps of:

a) generating a residuum at least as a function of a reference variable and the system output variable;

b) providing a constant threshold component;

c) providing an adaptive threshold component at least as a function of the temporally variable reference value; and d) providing a threshold by linking the constant threshold component to the adaptive threshold component; and e) comparing the residuum with the provided threshold to provide an analysis result, wherein generating a residuum comprises:

providing a system model for reproducing the system to be monitored, which receives the reference variable, an observer feedback variable and a disturbance model variable as inputs, and outputs, as a function thereof, an estimated system output variable;

forming a residuum from difference between the system output variable and the estimated system output variable;

providing an observer feedback, which receives the residuum as an input, and outputs, as a function thereof, the observer feedback variable for dynamic correction of the system model, in such a way that the estimated system output variable follows the system output variable; and providing a disturbance model, which receives the residuum as an input, and outputs, as a function thereof, the disturbance model variable for reproducing effects of the external disturbances on the system model, wherein the disturbance model variable comprises a dynamic disturbance model variable which is formed using a linear combination of a tuning matrix, an integrator and a disturbance variable matrix, the tuning matrix receiving the residuum as an input, and the disturbance variable matrix outputting the disturbance model variable.

* * * * *